United States Patent
Lee et al.

(10) Patent No.: US 8,145,970 B2
(45) Date of Patent: Mar. 27, 2012

(54) DATA PUNCTURING ENSURING ORTHOGONALITY WITHIN COMMUNICATION SYSTEMS

(75) Inventors: Tak K. Lee, Irvine, CA (US); Ba-Zhong Shen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 1206 days.

(21) Appl. No.: 11/851,147

(22) Filed: Sep. 6, 2007

(65) Prior Publication Data

US 2009/0067527 A1 Mar. 12, 2009

(51) Int. Cl.
*H03M 13/00* (2006.01)
*H04L 1/18* (2006.01)

(52) U.S. Cl. ........................ 714/751; 714/756
(58) Field of Classification Search .................. 714/751, 714/776
See application file for complete search history.

(56) References Cited

U.S. PATENT DOCUMENTS

| | | | | |
|---|---|---|---|---|
| 5,907,582 A * | 5/1999 | Yi | | 375/259 |
| 5,970,085 A * | 10/1999 | Yi | | 370/342 |
| 6,061,387 A * | 5/2000 | Yi | | 375/142 |
| 6,126,310 A * | 10/2000 | Osthoff et al. | | 714/751 |
| 6,308,294 B1 * | 10/2001 | Ghosh et al. | | 714/751 |
| 6,604,216 B1 * | 8/2003 | Javerbring et al. | | 714/751 |
| 6,697,986 B2 * | 2/2004 | Kim et al. | | 714/751 |
| 6,977,888 B1 * | 12/2005 | Frenger et al. | | 370/218 |
| 7,072,307 B2 * | 7/2006 | Tong et al. | | 370/253 |
| 7,099,298 B2 * | 8/2006 | Kim | | 370/342 |
| 7,146,552 B2 * | 12/2006 | Kim et al. | | 714/755 |
| 7,483,389 B2 * | 1/2009 | Tong et al. | | 370/253 |
| 7,492,751 B2 * | 2/2009 | Kim | | 370/342 |
| 7,512,860 B2 * | 3/2009 | Miyazaki et al. | | 714/751 |
| 2002/0046379 A1 * | 4/2002 | Miki et al. | | 714/749 |

OTHER PUBLICATIONS

Martin Döttling, Thomas Grundler and Alexander Seeger. "Incremental Redundancy and Bit-Mapping Techniques for High Speed Downlink Packet Access," Global Telecommunications Conference, 2003. GLOBECOM '03, IEEE Publication Date: Dec. 1-5, 2003 vol. 2, on pp. 908-912 vol. 2, ISBN: 0-7803-7974-8.

* cited by examiner

*Primary Examiner* — Joseph D Torres
(74) *Attorney, Agent, or Firm* — Garlick & Markison; Shayne X. Short

(57) ABSTRACT

Data puncturing ensuring orthogonality within communication systems. Puncturing is employed within communication systems to ensure orthogonality (or substantial orthogonality) of various transmissions between communication devices within communication systems. Any of a variety of types of signals can be employed herein including uncoded signals, turbo encoded signals, turbo trellis coded modulation (TTCM) encoded signals, LDPC (Low Density Parity Check) encoded signals, and a RS (Reed-Solomon) encoded signals, among just some types of signals. A first transmission can be made from a first communication device to a second communication device, and the second communication device can sometimes request a subsequent transmission (e.g., a re-transmission) from the first communication device to the second communication device. Oftentimes, different information is sent from the first communication device to the second communication device within the subsequent transmission. Herein, each of these transmissions can be ensured to be orthogonal.

25 Claims, 15 Drawing Sheets

DATA PUNCTURING ENSURING ORTHOGONALITY WITHIN COMMUNICATION SYSTEMS

CROSS REFERENCE TO RELATED PATENTS/PATENT APPLICATIONS

BACKGROUND OF THE INVENTION

1. Technical Field of the Invention

The invention relates generally to communication systems; and, more particularly, it relates to encoding and/or decoding of signals within such communication systems.

2. Description of Related Art

Data communication systems have been under continual development for many years. One such type of communication system that has been of significant interest lately is a communication system that employs iterative error correction codes. Of those, one particular type of communication system that has received interest in recent years has been one which employs turbo codes (one type of iterative error correcting code). Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

Generally speaking, within the context of communication systems that employ coding, there is a first communication device at one end of a communication channel with encoder capability and second communication device at the other end of the communication channel with decoder capability. In many instances, one or both of these two communication devices includes encoder and decoder capability (e.g., within a bi-directional communication system).

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
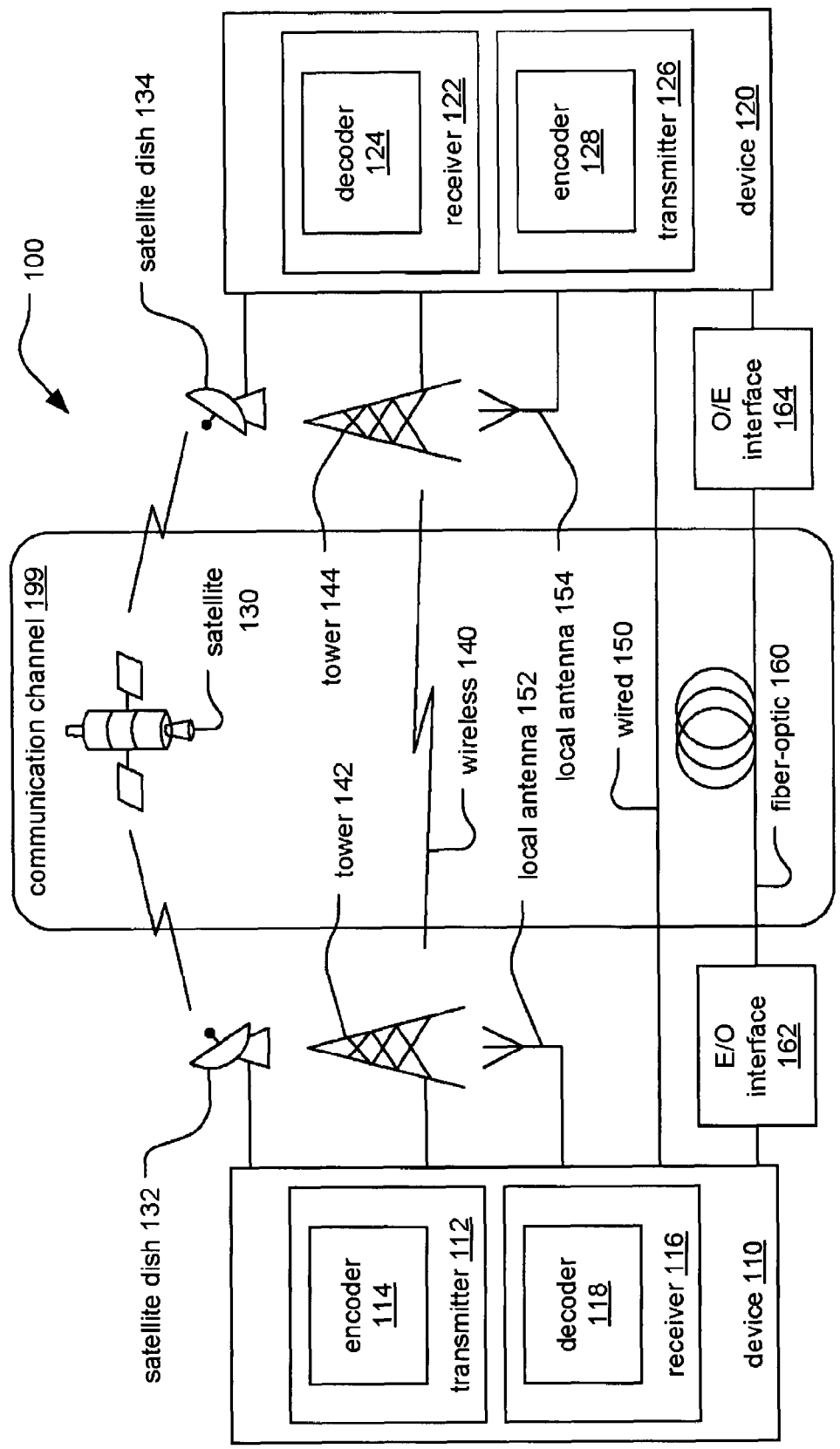
FIG. 1 and FIG. 2 illustrate various embodiments of communication systems.

A novel means is presented herein by which puncturing is employed within communication systems to ensure orthogonality (or substantial orthogonality) of various transmissions between communication devices within communication systems. Any of a variety of types of signals can be employed herein including uncoded signals, turbo encoded signals, turbo trellis coded modulation (TTCM) encoded signals, LDPC (Low Density Parity Check) encoded signals, and a RS (Reed-Solomon) encoded signals, among just some types of signals.

A first transmission can be made from a first communication device to a second communication device, and the second communication device can sometimes request a subsequent transmission (e.g., a re-transmission) from the first communication device to the second communication device. Oftentimes, different information is sent from the first communication device to the second communication device within the subsequent transmission. Herein, each of these transmissions can be ensured to be orthogonal. In some embodiments, circular shifting is employed in accordance with one or more stages of puncturing (some of which may operate on the very same bits) to ensure that each transmission is orthogonal to one another. When circular shifting is employed, there may be some overlap of bits within various transmissions (e.g., when the circular shifting reaches the end of the bits that are being circular shifted and wraps around the bits of interest undergoing circular shifting).

Sometimes, in a communication system that includes at least two communication devices, when decoding of a signal within a receiving communication device fails (e.g., of a signal received from another communication device via a communication channel), then the receiving communication device requests a re-transmission and/or another transmission from the sending communication device. This can involve a re-sending of the same information, and sometimes it involves a sending of different information. As one example in which an encoder generates systematic bits and redundancy (or parity bits), then during a first transmission perhaps only the systematic bits are sent. Then, during a second transmission perhaps both the systematic bits and the redundancy/parity bits are sent. Alternatively, during the second transmission perhaps only the redundancy/parity bits (or only a subset of the redundancy/parity bits) are sent. Many variations can be performed in which additional information is sent from the first/sending communication device to the second/receiving communication device during subsequent transmissions to provide for more information in an effort, hopefully, to be able to make a more accurate estimate of information sent. Sometimes, when additional information is sent in subsequent transmissions, this is referred to as providing incremental redundancy (e.g., such that each subsequent transmission provides a bit more information for use in the second/receiving communication device to be able to make a more accurate estimate of information sent.

When doing this (e.g., subsequent transmissions), it can be advantageous to ensure the orthogonality within the various transmissions through the communication channel. Appropriate puncturing, sometimes combined with appropriate circular shifting (e.g., as can be performed within a circular buffer) can be employed herein to ensure this orthogonality. Again, as mentioned above, this approach to ensure orthogonality can be broadly applied to any of a very wide variety of communication systems and coding types including those using uncoded signals, turbo encoded signals, turbo trellis coded modulation (TTCM) encoded signals, LDPC (Low Density Parity Check) encoded signals, and a RS (Reed-Solomon) encoded signals, among just some types of signals.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wired, wireless, fiber, copper, and other types of media as well.

Figure 2:
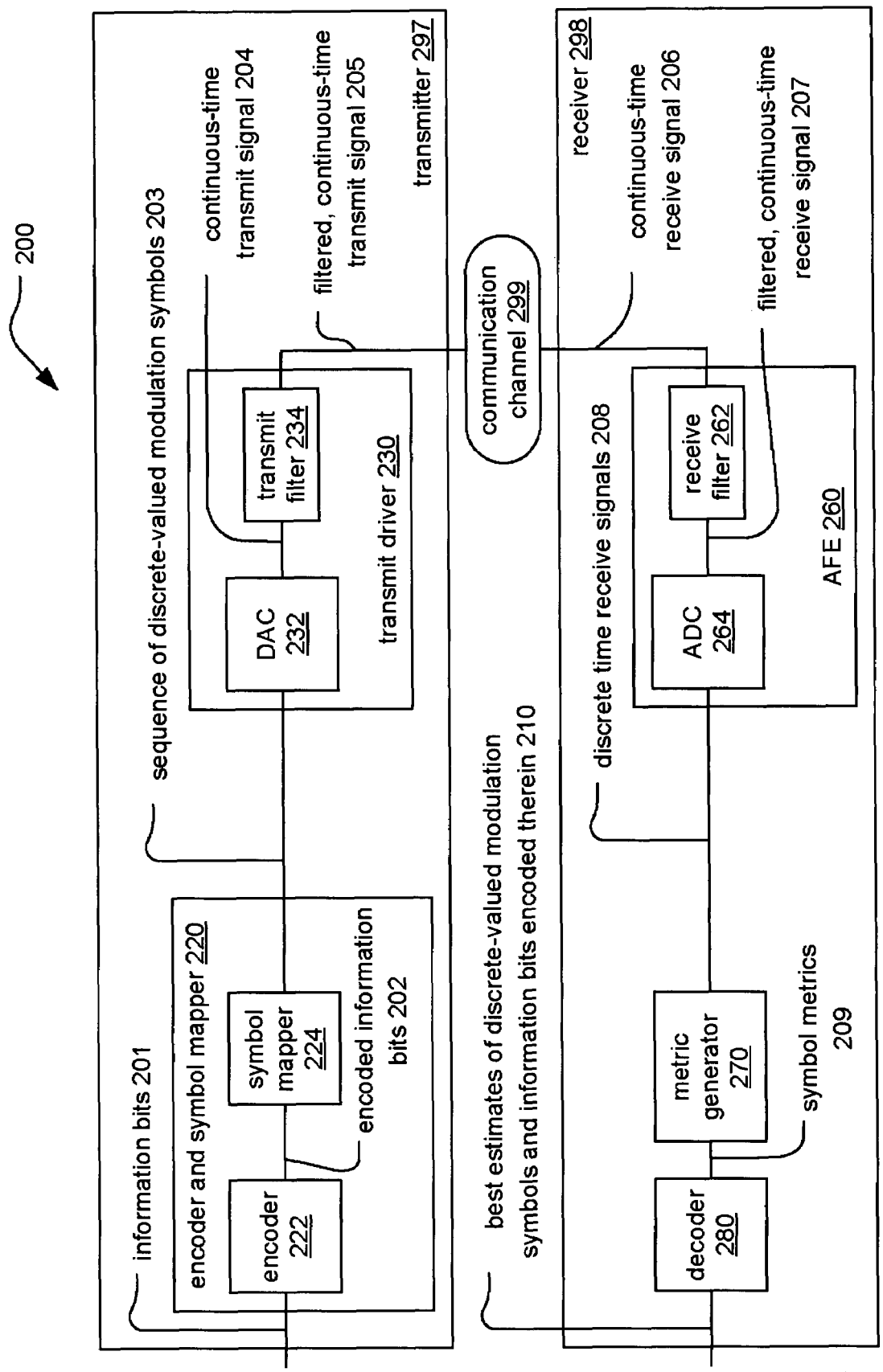

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively, and in which puncturing and/or circular shifting can be performed) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates symbol metrics 209 that are employed by a decoder 280 to make best estimates of the discrete-valued modulation symbols and information bits encoded therein 210.

The decoders of either of the previous embodiments may be implemented to include various aspects and/or embodiment of the invention therein. In addition, several of the following Figures describe other and particular embodiments (some in more detail) that may be used to support the devices, systems, functionality and/or methods that may be implemented in accordance with certain aspects and/or embodiments of the invention.

Various types of coded signals can be employed in this embodiment as well as within other embodiments as well, including uncoded signals, turbo encoded signals, turbo trellis coded modulation (TTCM) encoded signals, LDPC (Low Density Parity Check) encoded signals, and a RS (Reed-Solomon) encoded signals, among just some types of signals that can be employed in accordance with certain aspects of the invention.

Figure 3:
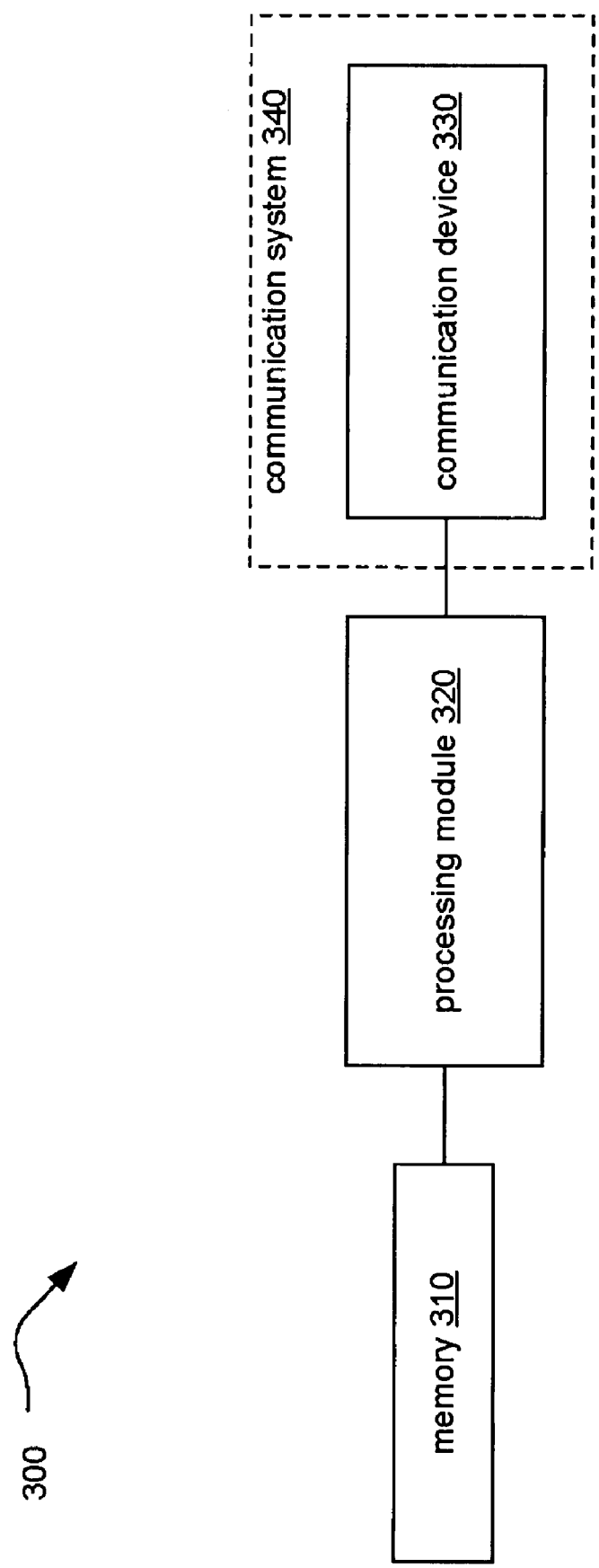
FIG. 3 illustrates an embodiment of an apparatus that is operable to be implemented within a communication system.

FIG. 3 illustrates an embodiment of an apparatus 300 that is operable to be implemented within a communication system. The apparatus 300 includes a processing module 320, and a memory 310. The memory 310 is coupled to the processing module, and the memory 310 is operable to store operational instructions that enable the processing module 320 to perform a variety of functions. The processing module 320 is operable to perform and/or direct the manner in which encoding and/or decoding processing is to be performed in accordance with any embodiment described herein, or any equivalent thereof.

The processing module 320 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 310 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 320 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the manner in which the encoding and/or decoding processing is to be performed can be provided from the apparatus 300 to a communication system 340 that is operable to employ and perform the particular type of encoding and/or decoding. For example, when considering one possible embodiment that employs an LDPC code, information corresponding to the LDPC code being used (e.g., the parity check matrix of the LDPC code) can also be provided from the processing module 320 to any of a variety of communication devices 330 implemented within the communication system 340 as well. In addition, the manner in which such LDPC decoding is to be performed within any of a variety of communication devices 330 implemented within the communication system 340 can also be provided from the processing module 320.

This providing of means and manner by which encoding and/or decoding is to be performed and communicated throughout the communication system 340 can also be extended to other types of encoding and/or decoding as well (e.g., communication systems and/or communication devices that employ uncoded signals, turbo encoded signals, turbo trellis coded modulation (TTCM) encoded signals, LDPC (Low Density Parity Check) encoded signals, and a RS (Reed-Solomon) encoded signals).

Moreover, the providing of means and manner by which puncturing, transmission, re-transmission, requests for re-transmission, circular shifting (e.g., as in a circular buffer) can also be communicated throughout the communication system 340 so various appropriate devices are operating in accordance with one another.

If desired, the apparatus 320 can be designed to generate multiple means of performing encoding and/or decoding in accordance with multiple needs and/or desires as well. In some embodiments, the processing module 320 can selectively provide different information (e.g., corresponding to different codes, coding methods, etc.) to different communication devices and/or communication systems. That way, different communication links between different communication devices can employ different codes and/or means by which to perform decoding. Clearly, the processing module 320 can also provide the same information to each of different communication devices and/or communication systems as well without departing from the scope and spirit of the invention.

Figure 4:
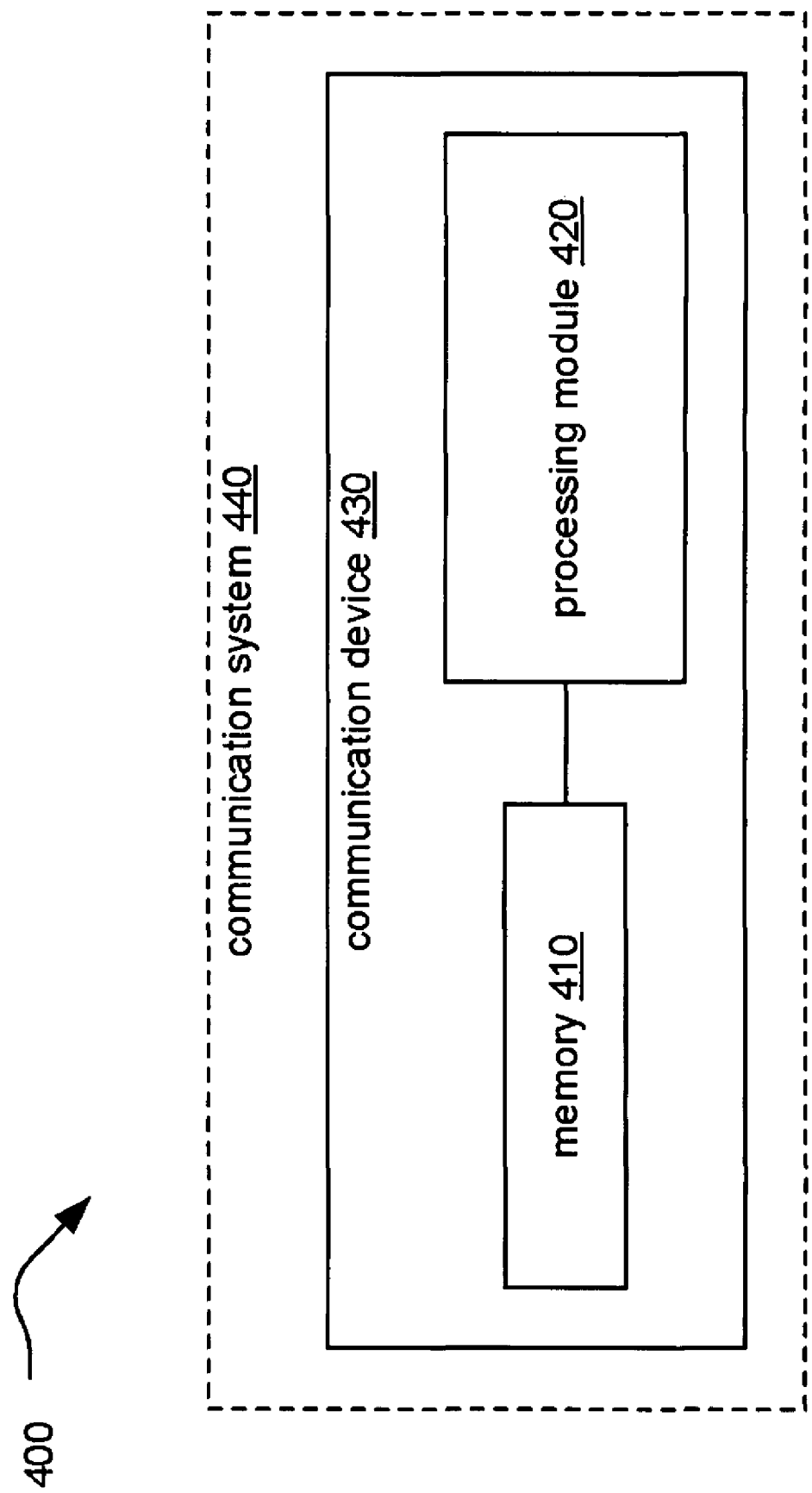
FIG. 4 illustrates an alternative embodiment of an apparatus that is operable to be implemented within a communication system.

FIG. 4 illustrates an alternative embodiment of an apparatus 400 that is operable to be implemented within a communication system. The apparatus 400 includes a processing module 420, and a memory 410. The memory 410 is coupled to the processing module, and the memory 410 is operable to store operational instructions that enable the processing module 420 to perform a variety of functions. The processing module 420 (serviced by the memory 420) can be implemented as an apparatus capable to perform any of the functionality of any of the various modules and/or functional blocks described herein. For example, the processing module 420 (serviced by the memory 420) can be implemented as an apparatus capable to perform and/or direct the manner in which LDPC decoding processing is to be performed in accordance with any embodiment described herein, or any equivalent thereof.

The processing module 420 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 410 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 420 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the apparatus 400 can be any of a variety of communication devices 430, or any part or portion of any such communication device 430. Any such communication device that includes the processing module 420 and/or memory 410 can be implemented within any of a variety of communication systems 440 as well. It is also noted that various embodiments of encoding and/or decoding processing such as those presented herein, and equivalents thereof, may be applied to many types of communication systems and/or communication devices.

Figure 5:
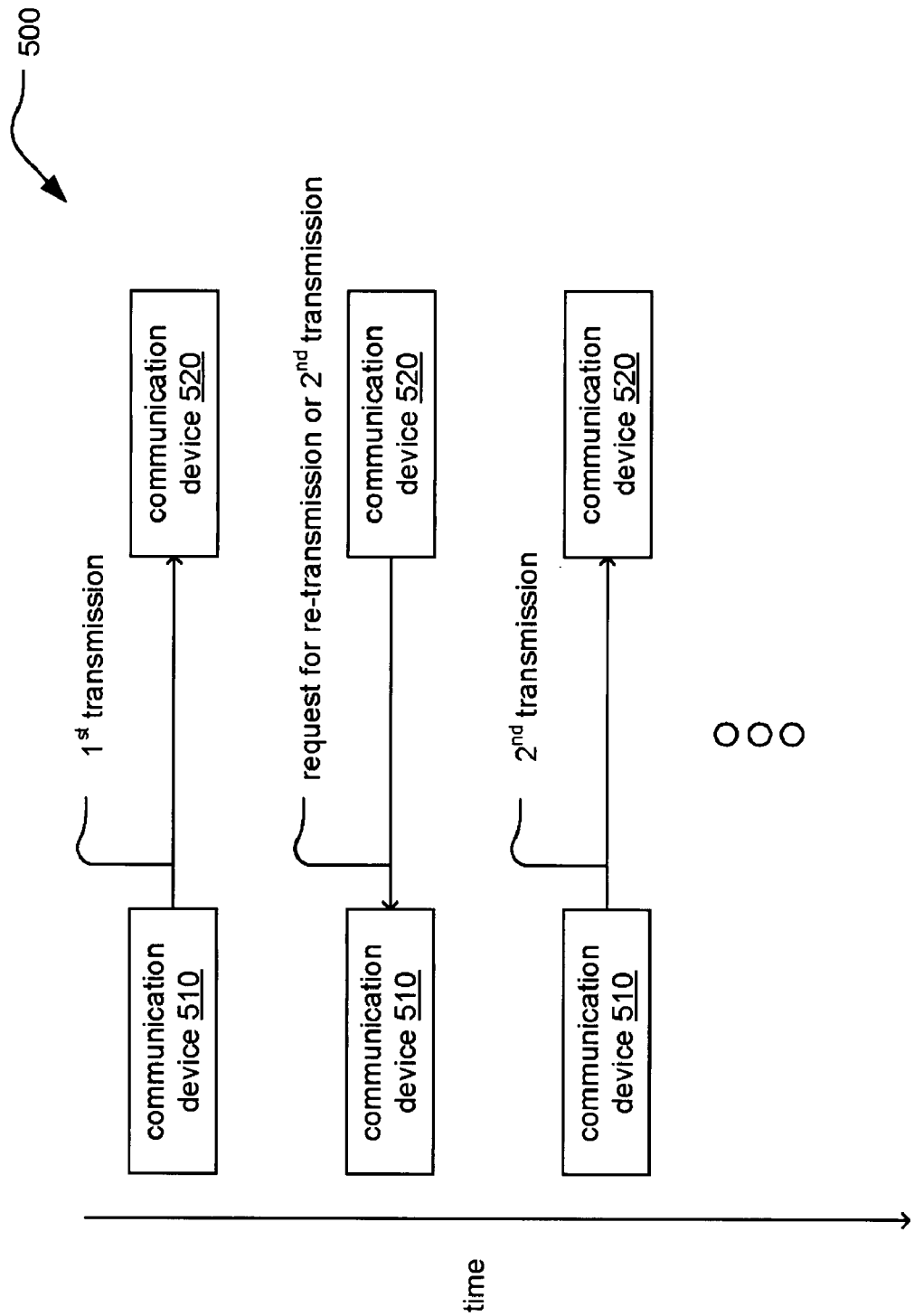
FIG. 5 illustrates an alternative embodiment of a communication system.

FIG. 5 illustrates an alternative embodiment of a communication system 500. In this embodiment, a communication device 510 firstly a first transmission via a communication channel to a communication device 520. For some reason (e.g., a failure in decoding of information within the $1^{st}$ transmission), the communication device 520 requests a re-transmission or a $2^{nd}$ transmission to be sent from the communication device 510. This can be viewed as a request for some incrementally increased redundancy to be provided to the communication device 520 to assist the communication device 520 to make a more accurate estimate of information sent from the communication device 510. Then, the communication device 510 sends a $2^{nd}$ transmission to the communication device 520.

This process can continue until there is sufficient degree of certainty within the communication device 520 that the communication device 520 has an accurate estimate of information sent from the communication device 510.

In some alternative embodiments, the communication device 510 can wait a certain period of time, and based upon no acknowledgement from the communication device 520, the communication device can re-transmit the same information and/or additional information to the communication device 520. There are a variety of means by which multiple transmissions can be made from a first communication device (e.g., communication device 510) to a second communication device (e.g., communication device 520) that fall within the scope and spirit of the invention. In many of these embodiments, it can be desirable to ensure that subsequent transmissions each are orthogonal to one another to a desired degree. For example, there can be perturbations within the communication channel that affect a certain portion of the signal a similar way each time, and it would then be advantageous not to keep having those same bits being affected the very same way. In one example, some bits can effectively be erased (or sufficiently smeared, spread, distorted, etc.) that an estimate of it cannot effectively be made. Sometimes, it may be desirable to re-send that same information and have it occupy a different portion of the transmitted signal, so that it will, hopefully, not undergo the same effects and be erased (or sufficiently smeared, spread, distorted, etc.) such that it can now be properly decoded. The orthogonality of these subsequent transmissions ensures that there is as little overlap (or no overlap) between the original transmission and subsequent transmissions.

Figure 6:
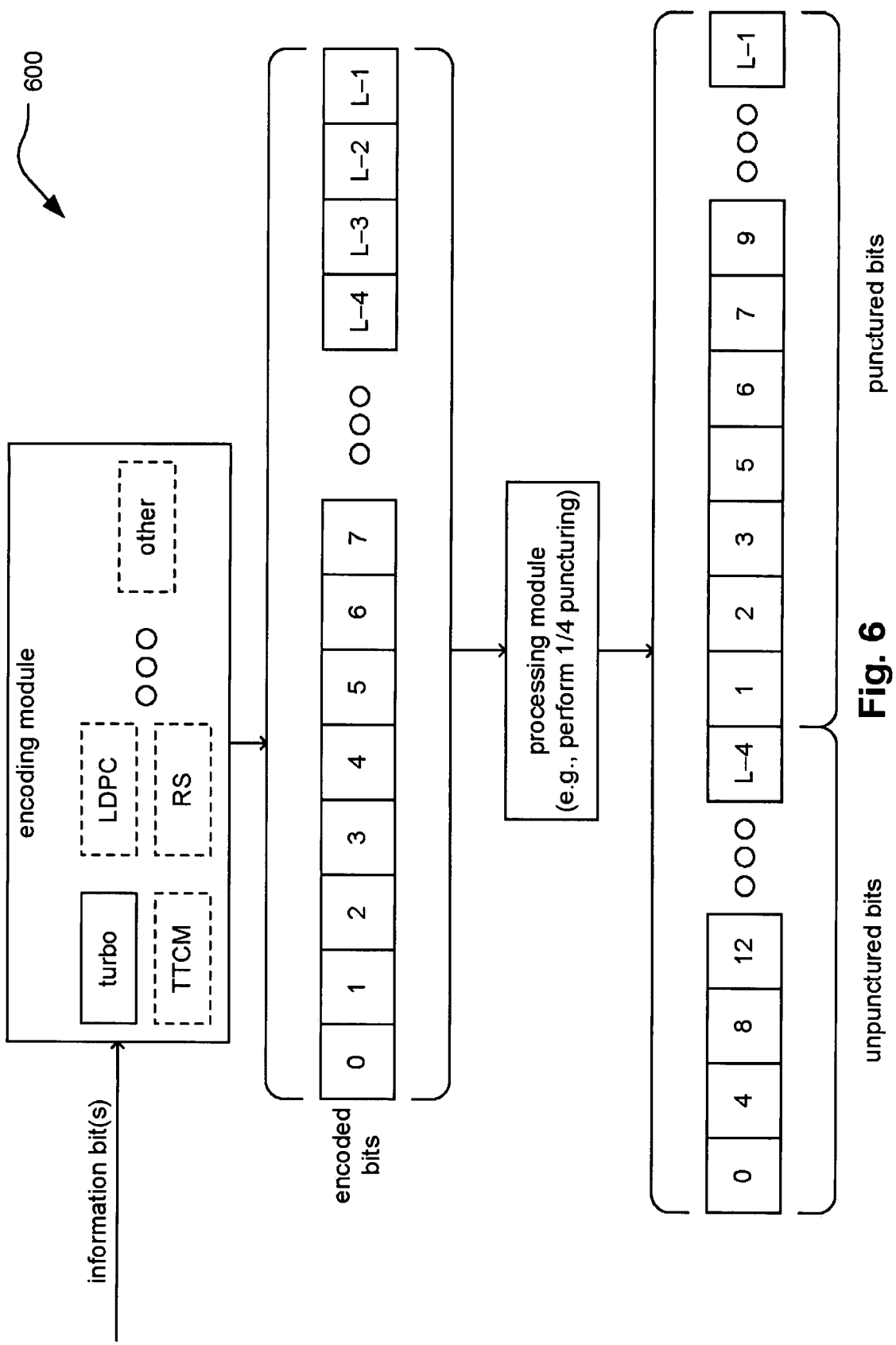
FIG. 6 illustrates an embodiment of puncturing of encoded bits.

FIG. 6 illustrates an embodiment 600 of puncturing of encoded bits. At least one information bit is provided to an encoding module (e.g., or an encoder) from which a plurality of encoded bits are output. This can include performing systematic encoding in which the at least one information bit is actually part of the output from the encoding module in addition to at least one redundancy/parity bit. Alternatively, this can include performing non-systematic encoding in which the output from the encoding module includes all redundancy/parity bits in which the input is not explicitly a part thereof. Either type of encoding (or combination thereof) can be employed without departing from the scope and spirit of the invention.

In addition, as mentioned above, the encoding employed herein can be broadly applied to any of a very wide variety of communication systems and coding types including those using uncoded signals, turbo encoded signals, turbo trellis coded modulation (TTCM) encoded signals, LDPC (Low Density Parity Check) encoded signals, and a RS (Reed-Solomon) encoded signals, among just some types of signals.

The encoded bits output from the encoding module are then provided to a processing module (e.g., or a puncturer) that is operable to perform puncturing of the encoded bits in accordance with at least one type of puncturing. Sometimes, the puncturing module is operable to perform multiple puncturings that are either calculated in real-time or selected from among a plurality of predetermined puncturings (e.g., such as could be stored in some form of memory). Whichever implementation is employed, the processing module that is operable to perform puncturing generates a plurality of unpunctured bits and a plurality of punctured bits from the encoded bits.

Sometimes, within communication systems, because of bandwidth considerations, only a subset of the bits of one or more codewords (and/or encoded bits) undergo transmission from a first communication device to a second communication device within a communication system. Those bits that are not selected to undergo transmission are punctured out (e.g., the punctured bits). However, as is seen in other embodiments depicted herein, it can be seen that those first punctured bits are sometimes employed for use in subsequent transmissions as well.

In this diagram, puncturing of a 1/4 puncturing pattern is shown. The encoded bits (or codewords) include bits 0, 1, 2, . . . , L-4, L-3, L-2, L-1. Every $4^{th}$ bit is partitioned into the unpunctured bits (e.g., bits 0, 4, 8, 12, . . . ) and those others bits are then the punctured bits (e.g., bits 1, 2, 3, 5, . . . ).

In some embodiments, it is the unpunctured bits that undergo the first transmission. Then, during subsequent transmissions, some or all of the punctured bits then undergo transmission. When employing circular shifting/buffering as well, there may be subsequent transmissions that include some of the original unpunctured bits therein as well. There are a variety of combinations by which puncturing, shifting/buffering can be made to produce bits for first, second, and/or subsequent transmissions.

Figure 7:
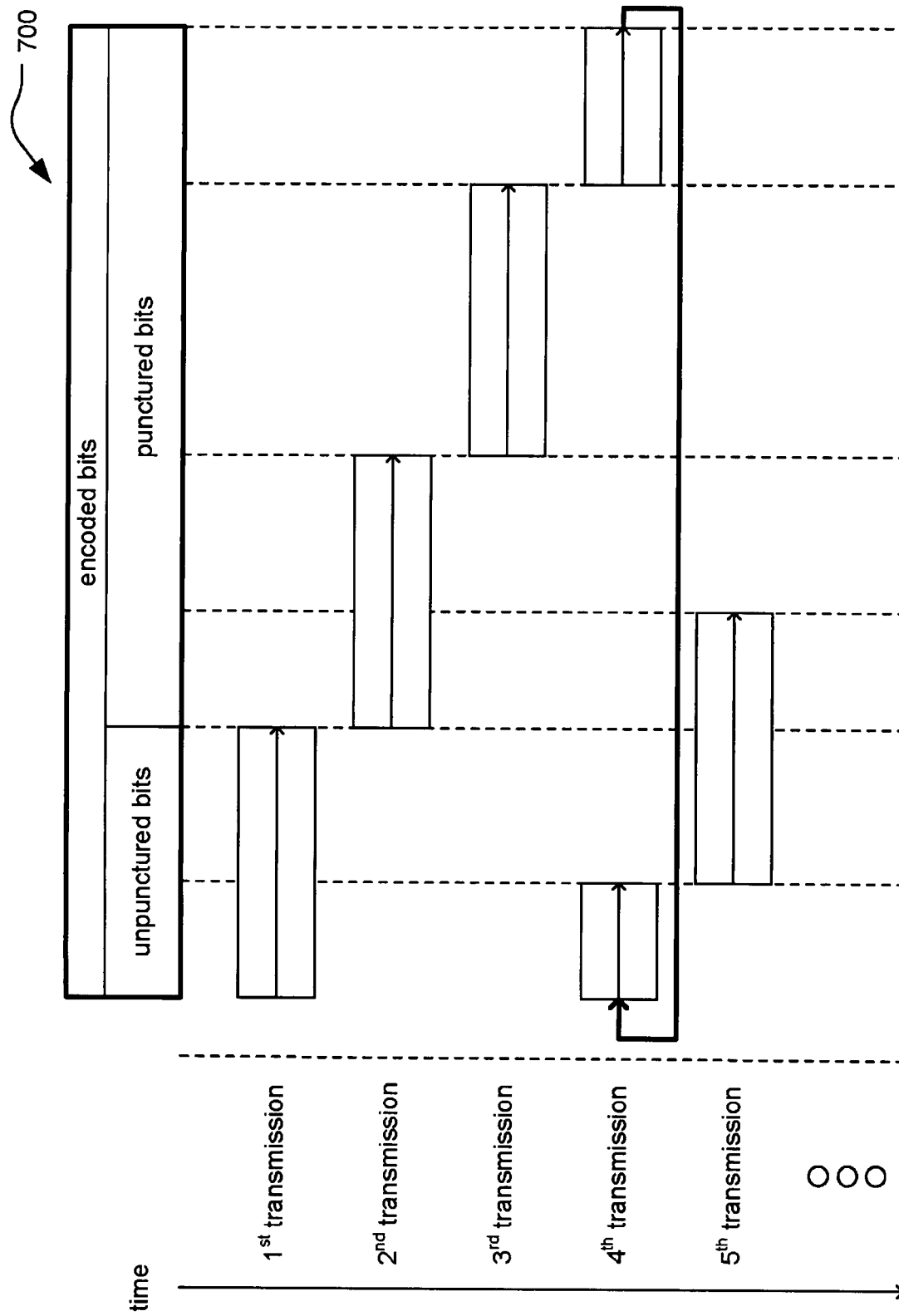
FIG. 7 illustrates an embodiment of circular shifting of encoded bits.

FIG. 7 illustrates an embodiment 700 of circular shifting of encoded bits. In this diagram, encoded bits include unpunctured bits and punctured bits can undergo circular shifting to ensure that different sets bits are output during each subsequent transmission.

During a first transmission, the unpunctured bits are sent out.

During a second transmission, a first subset of the punctured bits is sent out. In this embodiment, the size of the circular buffer that is operable to perform the circular shifting is the same size of the number of unpunctured bits within the encoded bits. Therefore, the number of bits within this $2^{nd}$ transmission (and subsequent transmissions) is the same number of bits within the $1^{st}$ transmission.

During a third transmission, a second subset of the punctured bits (that follows the first subset of the punctured bits) is sent out.

During a forth transmission, a third subset of the punctured bits (that follows the second subset of the punctured bits until the end of the punctured bits) and a portion of the unpunctured bits are both sent out. As can be seen, the circular shifting of the encoded bits has reached the end thereof, so the circular shifting now wraps around and employs a first subset of the punctured bits. In alternative embodiments, the circular shifting could then only be applied to the punctured bits [e.g., in which a third subset of the punctured bits (that follows the second subset of the punctured bits until the end of the punctured bits) and a first portion of the punctured bits would be sent out]. Again, there are a variety of means, embodiments, and ways in which this puncturing and/or circular buffering can be performed without departing from the scope and spirit of the invention.

During a fifth transmission, a second subset of the punctured bits (that follows the first subset of the punctured bits sent out in the fourth transmission) and another subset of the punctured bits (that immediately follows the second subset of the punctured bits) are sent out.

As can be seen, each subsequent transmission has little or no overlap whatsoever. However, depending on the size and number of the codewords and/or encoded bits that undergo this processing, then there can be some overlap between various of the transmissions (e.g., the first and fourth transmissions have some overlap; the first and fifth transmissions have some overlap; the second and fifth transmissions have some overlap, and so on). However, there is ensured a high degree of orthogonality (e.g., little overlap) between successive transmissions.

It is noted also that various combinations of puncturing and circular buffer of one or more of the puncturing resultants can also be performed without departing from the scope and spirit of the invention. As one example, puncturing can be performed on encoded bits to generate first unpunctured bits and first punctured bits. None, one or both of the first unpunctured bits and the first punctured bits can undergo circular buffering and one or both of the first unpunctured bits and the first punctured bits can then also undergo second puncturing to generate second unpunctured bits and second punctured bits. A wide variety of embodiments can be implemented within the without departing from the scope and spirit of the invention, and some possible embodiments are described below and elsewhere herein.

FIG. 8, FIG. 9, FIG. 10, FIG. 11, FIG. 12, and FIG. 13 illustrate embodiments of more than one stage of puncturing of encoded bits.

Figure 8:
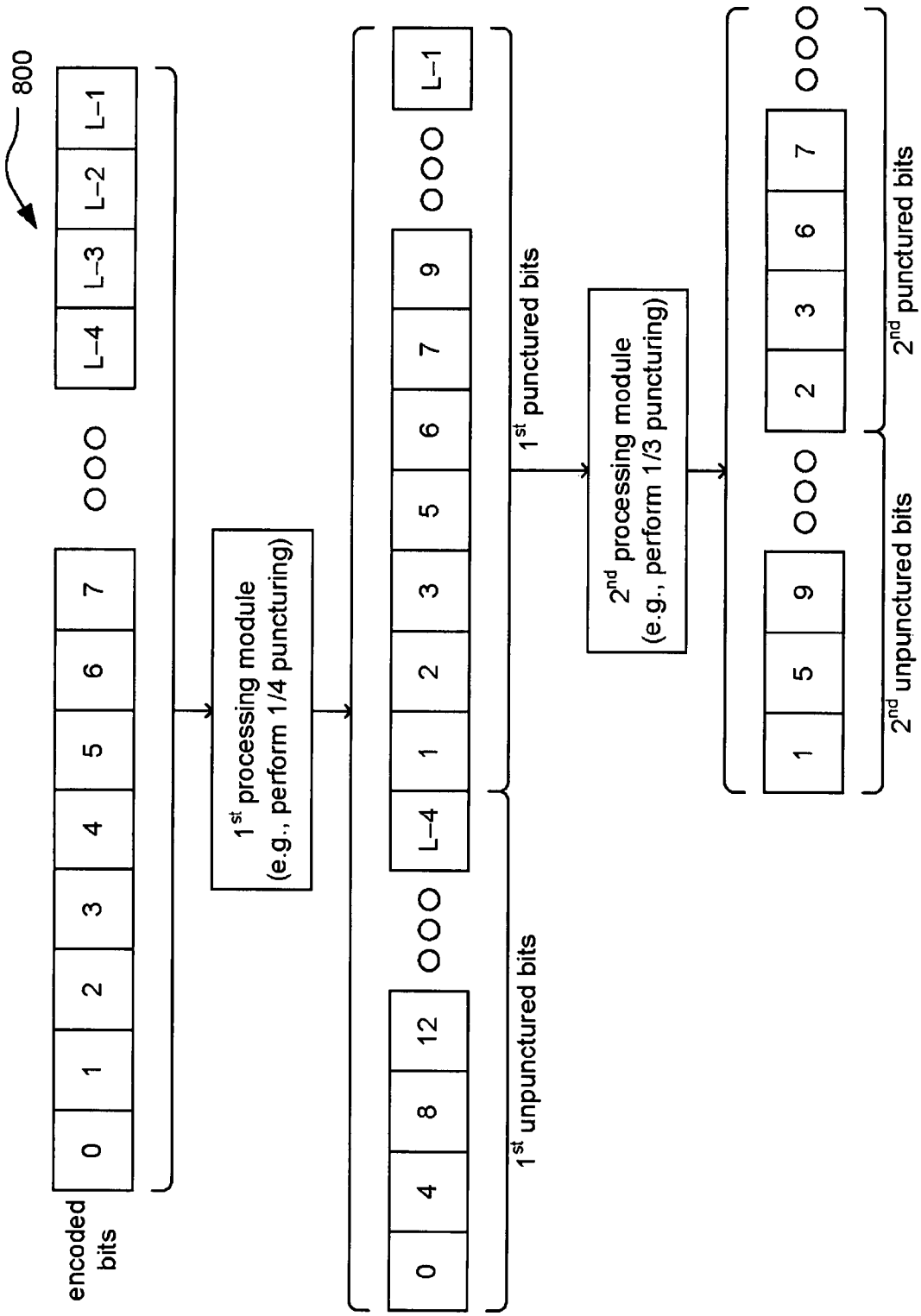
FIG. 8, FIG. 9, FIG. 10, FIG. 11, FIG. 12, and FIG. 13 illustrate embodiments of more than one stage of puncturing of encoded bits.

Referring to FIG. 8, embodiment 800 shows multiple stages of puncturing on encoded bits. A first puncturing is performed on the encoded bits within a $1^{st}$ processing module. In this diagram, the $1^{st}$ processing module is operable to perform 1/4 puncturing to generate $1^{st}$ unpunctured bits and $1^{st}$ punctured bits.

Thereafter, the $1^{st}$ punctured bits undergo $2^{nd}$ puncturing within a $2^{nd}$ processing module to generate $2^{nd}$ unpunctured bits and $2^{nd}$ punctured bits. In this diagram, the $2^{nd}$ processing module is operable to perform 1/3 puncturing to generate the $2^{nd}$ unpunctured bits and the 2 punctured bits.

If desired in alternative embodiments, the $1^{st}$ punctured bits could also undergo puncturing within the $2^{nd}$ processing module as well thereby either modifying the $2^{nd}$ unpunctured bits and the $2^{nd}$ punctured bits or generating $3^{rd}$ unpunctured bits and $3^{rd}$ punctured bits as well.

Figure 9:
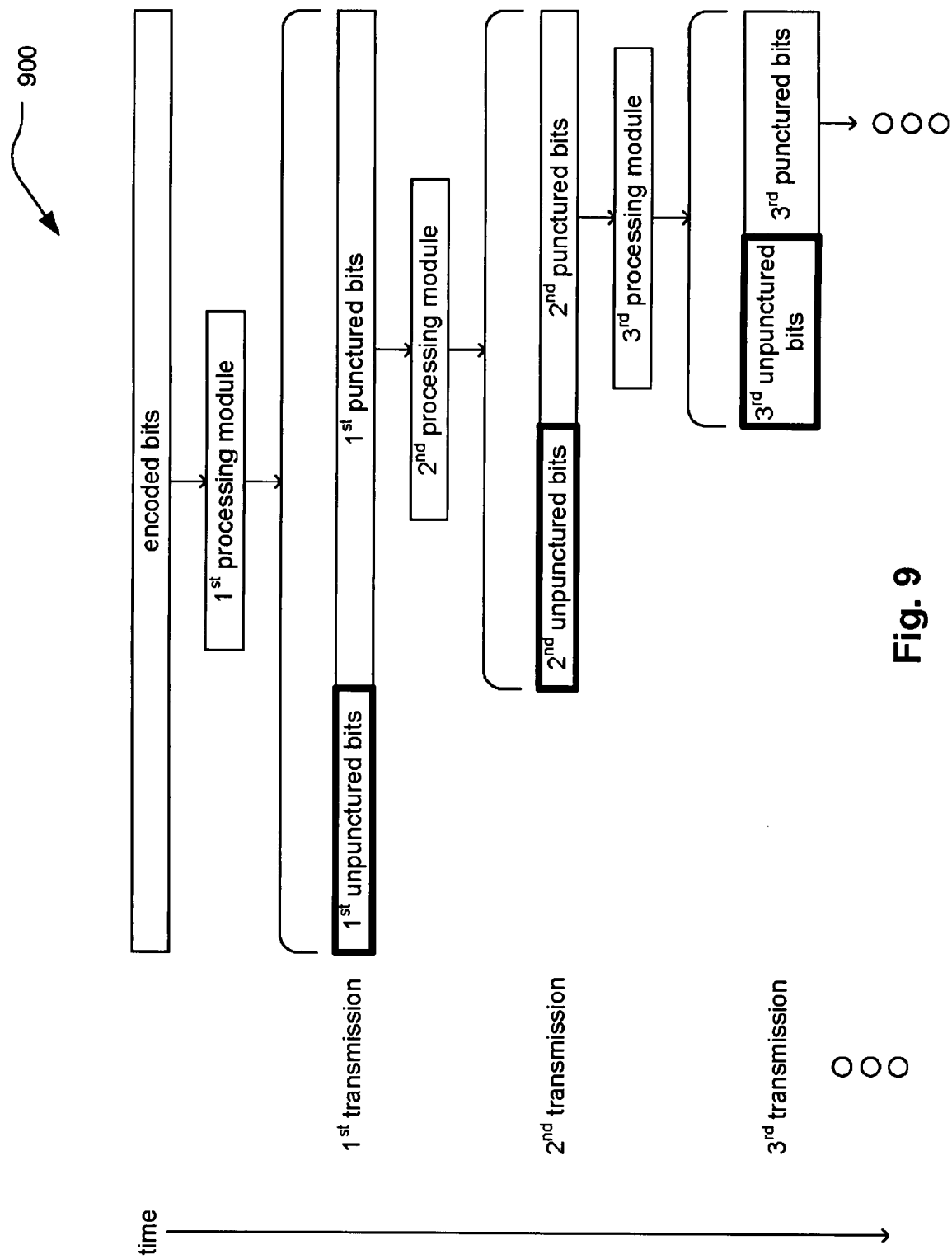

Referring to FIG. 9, embodiment 900 also shows multiple stages of puncturing and how selected bits within each stage can be employed for various transmissions from a communication device implemented within a communication system.

Encoded bits undergo $1^{st}$ puncturing within a $1^{st}$ processing module to generate $1^{st}$ unpunctured bits and $1^{st}$ punctured bits. The $1^{st}$ unpunctured bits are sent out within a $1^{st}$ transmission from a communication device implemented within the communication system.

The $1^{st}$ punctured bits undergo $2^{nd}$ puncturing within a $2^{nd}$ processing module to generate $2^{nd}$ unpunctured bits and $2^{nd}$ punctured bits. The $2^{nd}$ unpunctured bits are sent out within a $2^{nd}$ transmission from the communication device implemented within the communication system.

The $2^{nd}$ punctured bits undergo $3^{rd}$ puncturing within a $3^{rd}$ processing module to generate $3^{rd}$ unpunctured bits and $3^{rd}$ punctured bits. The $3^{rd}$ unpunctured bits are sent out within a $2^{nd}$ transmission from the communication device implemented within the communication system.

Figure 10:
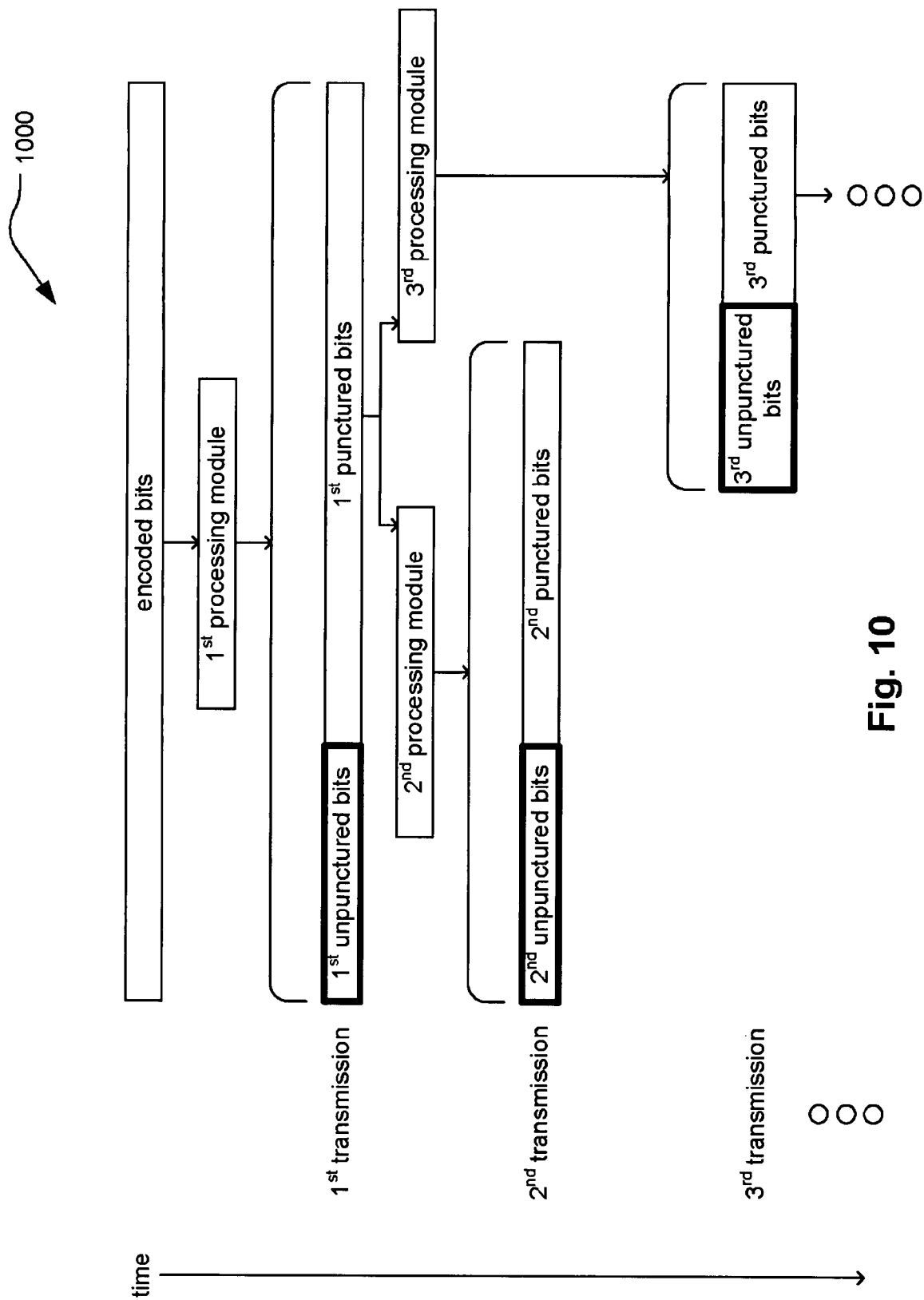

Referring to FIG. 10, embodiment 1000 also shows multiple stages of puncturing and/or circular buffering and how selected bits within each stage can be employed for various transmissions from a communication device implemented within a communication system.

Encoded bits undergo $1^{st}$ puncturing within a $1^{st}$ processing module to generate $1^{st}$ unpunctured bits and $1^{st}$ punctured bits. The $1^{st}$ unpunctured bits are sent out within a $1^{st}$ transmission from a communication device implemented within the communication system.

The $1^{st}$ punctured bits undergo $2^{nd}$ puncturing within a $2^{nd}$ processing module to generate $2^{nd}$ unpunctured bits and $2^{nd}$ punctured bits. Also, the $1^{st}$ punctured bits undergo $3^{rd}$ puncturing within a $3^{rd}$ processing module to generate $3^{rd}$ unpunctured bits and $3^{rd}$ punctured bits. Each of the puncturings being performed within the $2^{nd}$ processing module and the $3^{rd}$ processing module can be different, such that the $2^{nd}$ unpunctured bits and $2^{nd}$ punctured bits and the $3^{rd}$ unpunctured bits and $3^{rd}$ punctured bits, respectively, are not the same bits.

The $2^{nd}$ unpunctured bits are sent out within a $2^{nd}$ transmission from the communication device implemented within the communication system, and the $3^{rd}$ unpunctured bits are sent out within a $2^{nd}$ transmission from the communication device implemented within the communication system. Again, the $2^{nd}$ unpunctured bits need not be the same bits as within the $3^{rd}$ unpunctured bits, as different puncturings can be performed within each of the $2^{nd}$ processing module and the $3^{rd}$ processing module.

Figure 11:
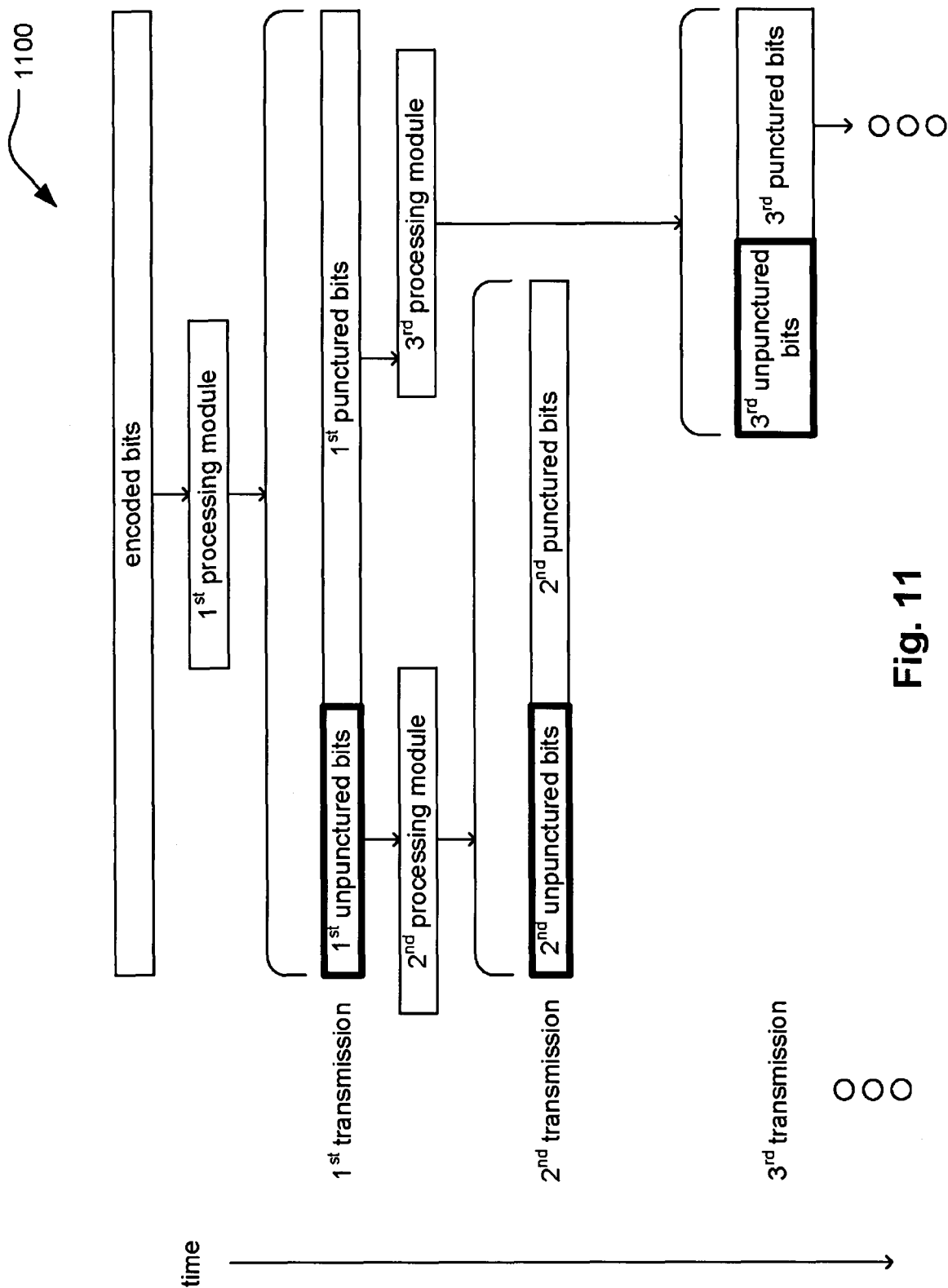

Referring to FIG. 11, embodiment 1100 also shows multiple stages of puncturing and/or circular buffering and how selected bits within each stage can be employed for various transmissions from a communication device implemented within a communication system.

Encoded bits undergo $1^{st}$ puncturing within a $1^{st}$ processing module to generate $1^{st}$ unpunctured bits and $1^{st}$ punctured bits. The $1^{st}$ unpunctured bits are sent out within a $1^{st}$ transmission from a communication device implemented within the communication system.

The $1^{st}$ unpunctured bits undergo $2^{nd}$ puncturing within a $2^{nd}$ processing module to generate $2^{nd}$ unpunctured bits and $2^{nd}$ punctured bits. However, the $1^{st}$ punctured bits (e.g., not the $1^{st}$ unpunctured bits) undergo $3^{rd}$ puncturing within a $3^{rd}$ processing module to generate $3^{rd}$ unpunctured bits and $3^{rd}$ punctured bits. Each of the puncturings being performed within the $2^{nd}$ processing module and the $3^{rd}$ processing module can be different.

The $2^{nd}$ unpunctured bits are sent out within a $2^{nd}$ transmission from the communication device implemented within the communication system, and the $3^{rd}$ unpunctured bits are sent out within a $2^{nd}$ transmission from the communication device implemented within the communication system.

Figure 12:
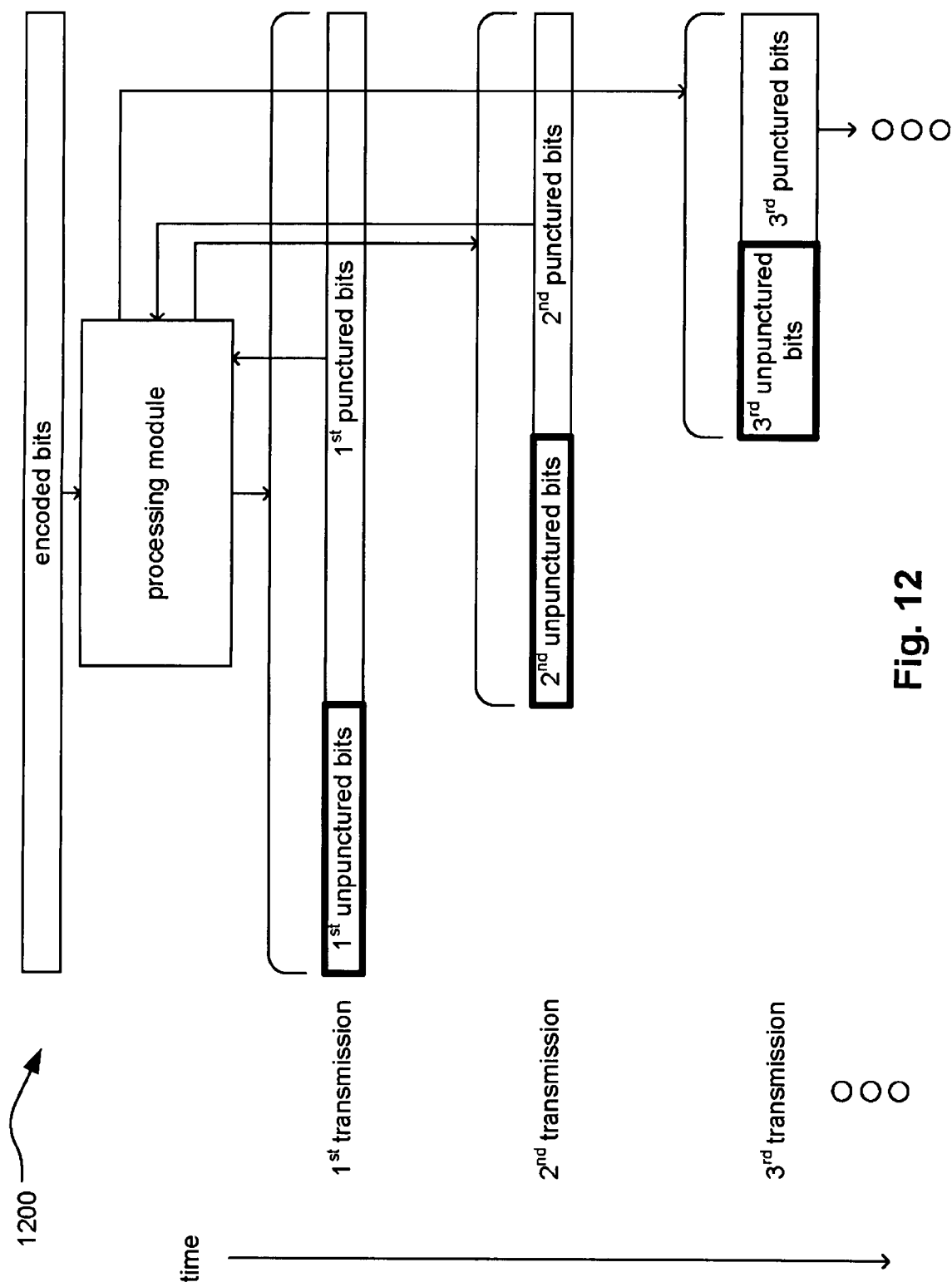

Referring to FIG. 12, embodiment 1200 also shows multiple stages of puncturing and/or circular buffering and how selected bits within each stage can be employed for various transmissions from a communication device implemented within a communication system.

This embodiment 1200 is somewhat analogous to the embodiment 900 of FIG. 9, with at least one difference being that only a singular processing module is employed in embodiment 1200 of FIG. 12. If desired, each of the puncturings performed in this embodiment (even though they are performed within a singular processing module) can be different. For example, the singular processing module can be implemented and operable to perform more than one type of puncturing. This capability can be extended to other embodiments as well, in that, fewer processing modules can be employed/re-used for multiple stages of puncturing.

Encoded bits undergo $1^{st}$ puncturing within the singular processing module to generate $1^{st}$ unpunctured bits and $1^{st}$ punctured bits. The $1^{st}$ unpunctured bits are sent out within a $1^{st}$ transmission from a communication device implemented within the communication system.

The $1^{st}$ punctured bits are passed back to the singular processing module and undergo $2^{nd}$ puncturing within the singular processing module to generate $2^{nd}$ unpunctured bits and $2^{nd}$ punctured bits. The $2^{nd}$ unpunctured bits are sent out within a $2^{nd}$ transmission from the communication device implemented within the communication system.

The $2^{nd}$ punctured bits are passed back to the singular processing module and undergo $3^{rd}$ puncturing within the singular processing module to generate $3^{rd}$ unpunctured bits and $3^{rd}$ punctured bits. The $3^{rd}$ unpunctured bits are sent out within a $2^{nd}$ transmission from the communication device implemented within the communication system.

Figure 13:
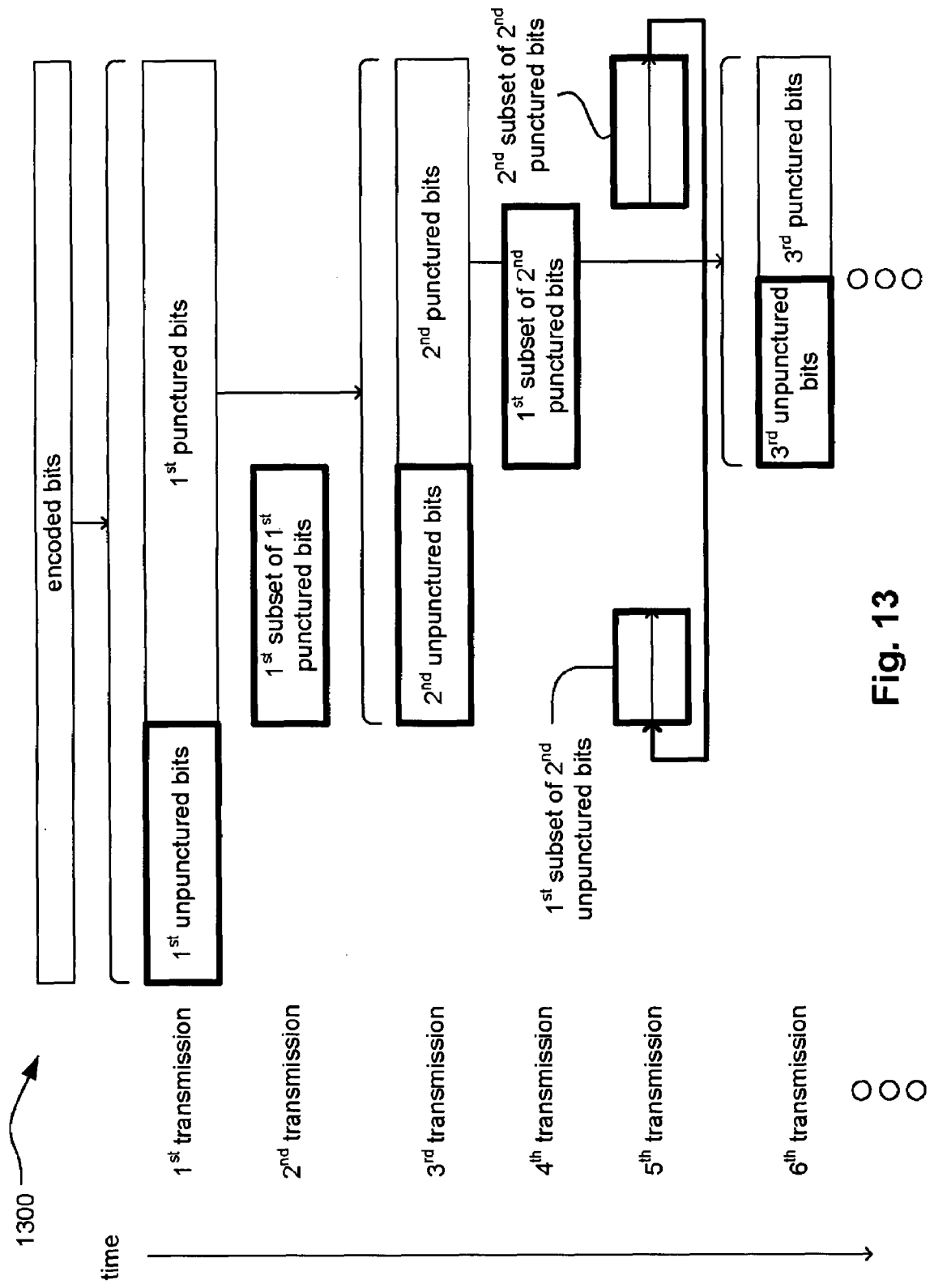

Referring to FIG. 13, embodiment 1300 also shows multiple stages of puncturing and/or circular buffering and how selected bits within each stage can be employed for various transmissions from a communication device implemented within a communication system.

Encoded bits undergo $1^{st}$ puncturing within one or more processing modules to generate $1^{st}$ unpunctured bits and $1^{st}$ punctured bits. The $1^{st}$ unpunctured bits are sent out within a $1^{st}$ transmission from a communication device implemented within the communication system, and a $1^{st}$ subset of the $1^{st}$ punctured bits is sent out within a $2^{nd}$ transmission from the communication device implemented within the communication system.

The $1^{st}$ punctured bits undergo $2^{nd}$ puncturing within one or more processing modules to generate $2^{nd}$ unpunctured bits and $2^{nd}$ punctured bits. The $2^{nd}$ unpunctured bits are sent out within a $3^{rd}$ transmission from the communication device implemented within the communication system, and a $1^{st}$ subset of the $2^{nd}$ punctured bits is sent out within a $4^{th}$ transmission from the communication device implemented within the communication system.

During a $5^{th}$ transmission from the communication device implemented within the communication system, 1 $2^{nd}$ subset of the $2^{nd}$ punctured bits combined with a $1^{st}$ subset of the $2^{nd}$ unpunctured bits (e.g., as could be generated in accordance with circular buffering) are sent out.

The $1^{st}$ subset of the $2^{nd}$ punctured bits undergo $3^{rd}$ puncturing within one or more processing modules to generate $3^{rd}$ unpunctured bits and $3^{rd}$ punctured bits. The $3^{rd}$ unpunctured bits are sent out within a $6^{th}$ transmission from the communication device implemented within the communication system.

Each of these various embodiments depicted above show the great deal of variability, programmability, and selectivity that can be performed when performing the puncturing and/or circular buffering, and other aspects depicted herein, to ensure orthogonality and/or a very little amount of overlap between successive and subsequent transmissions from a first communication device to a second communication device within a communication system.

It is noted that each of the various types of bits that are "sent out" (e.g., from a processing module, puncturing module, circular buffer, etc.) appropriately undergo any necessary modulation to generate a signal that comports with communication channel for a signal's transmission via that communication channel.

Figure 14:
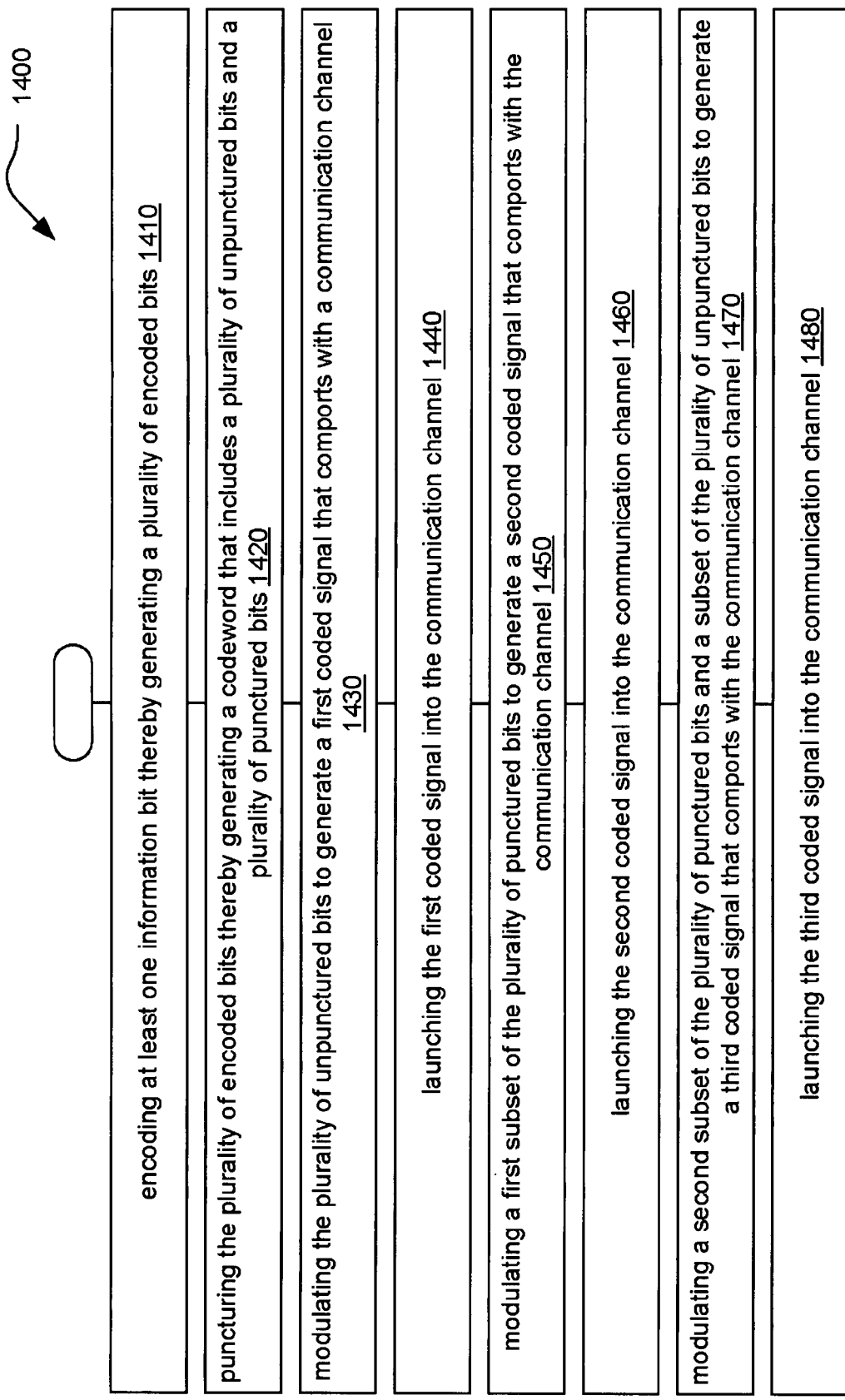
FIG. 14 and FIG. 15 illustrate embodiment of methods for processing signals.
Figure 15:
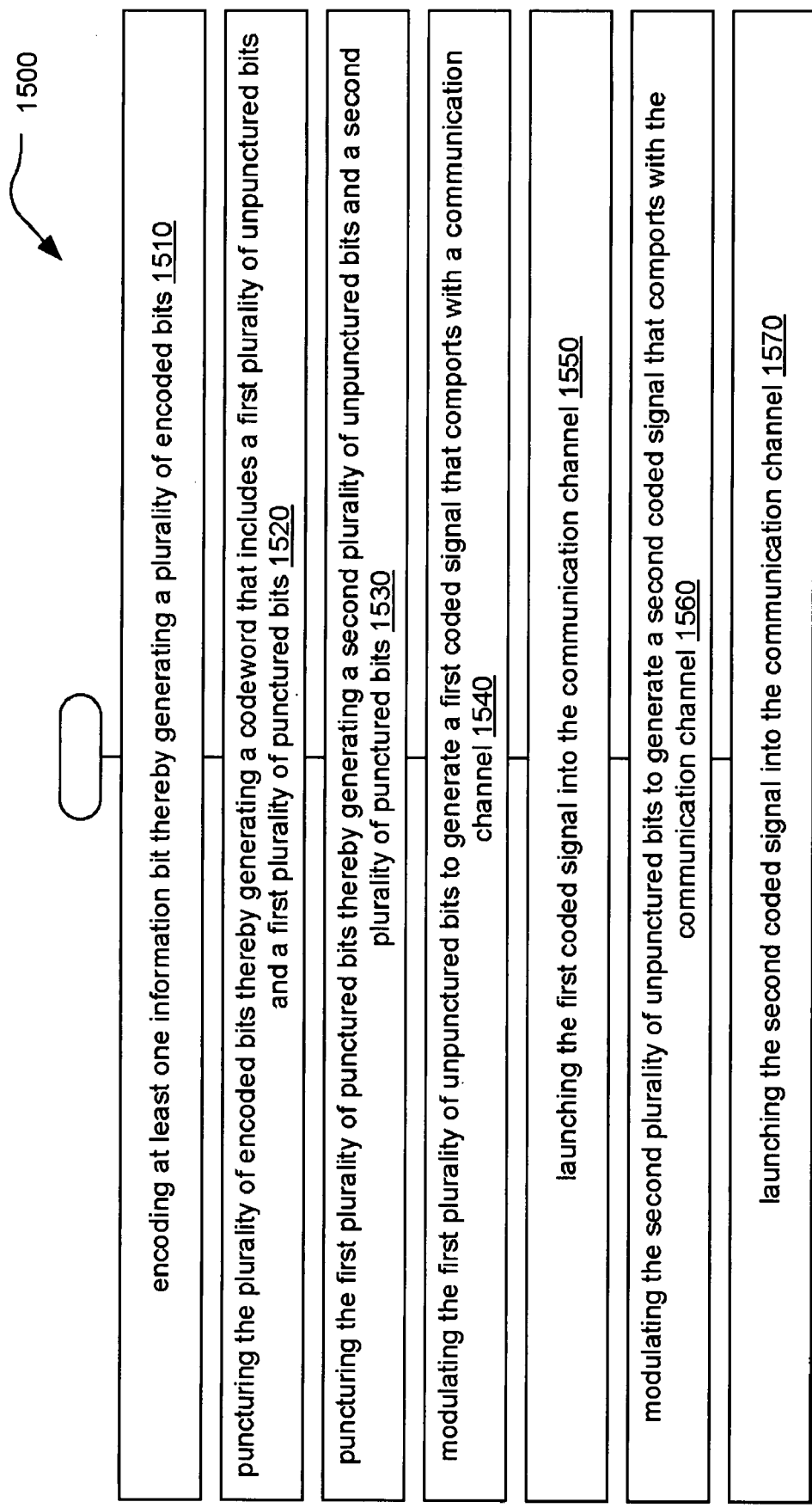

FIG. 14 and FIG. 15 illustrate embodiment of methods for processing signals

Referring to FIG. 14, the method 1400 initially involves encoding at least one information bit thereby generating a plurality of encoded bits, as shown in a block 1410. The method 1400 continues by puncturing the plurality of encoded bits thereby generating a codeword that includes a plurality of unpunctured bits and a plurality of punctured bits, as shown in a block 1420.

The method 1400 continues by modulating the plurality of unpunctured bits to generate a first coded signal that comports with a communication channel, as shown in a block 1430. The method 1400 continues by launching the first coded signal into the communication channel, as shown in a block 1440.

The method 1400 continues by modulating a first subset of the plurality of punctured bits to generate a second coded signal that comports with the communication channel, as shown in a block 1450. The method 1400 continues by launching the second coded signal into the communication channel, as shown in a block 1460.

The method 1400 continues by modulating a second subset of the plurality of punctured bits and a subset of the plurality of unpunctured bits to generate a third coded signal that comports with the communication channel, as shown in a block 1470. The method 1400 continues by launching the third coded signal into the communication channel, as shown in a block 1480.

Referring to FIG. 15, the method 1500 initially involves encoding at least one information bit thereby generating a plurality of encoded bits, as shown in a block 1510.

The method 1500 continues by encoding at least one information bit thereby generating a plurality of encoded bits, as shown in a block 1510. The method 1500 continues by puncturing the plurality of encoded bits thereby generating a codeword that includes a first plurality of unpunctured bits and a first plurality of punctured bits, as shown in a block 1510.

The method 1500 continues by puncturing the first plurality of punctured bits thereby generating a second plurality of unpunctured bits and a second plurality of punctured bits, as shown in a block 1510. The method 1500 continues by modulating the first plurality of unpunctured bits to generate a first coded signal that comports with a communication channel, as shown in a block 1510. The method 1500 continues by launching the first coded signal into the communication channel, as shown in a block 1510.

The method 1500 continues by modulating the second plurality of unpunctured bits to generate a second coded signal that comports with the communication channel, as shown in a block 1510. The method 1500 continues by launching the second coded signal into the communication channel, as shown in a block 1510.

It is noted that the various modules (e.g., encoding modules, decoding modules, processing modules, etc.) described herein may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The operational instructions may be stored in a memory. The memory may be a single memory device or a plurality of memory devices. Such a memory device may be a read-only memory, random access memory, volatile memory, non-volatile memory, static memory, dynamic memory, flash memory, and/or any device that stores digital information. It is also noted that when the processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. In such an embodiment, a memory stores, and a processing module coupled thereto executes, operational instructions corresponding to at least some of the steps and/or functions illustrated and/or described herein.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed is:

1. A communication device, comprising:
an encoder for encoding at least one information bit thereby generating a plurality of encoded bits;
a processing module for:
puncturing the plurality of encoded bits thereby generating a codeword including a first plurality of unpunctured bits and a first plurality of punctured bits; and
based on the first plurality of punctured bits being passed back to the processing module, puncturing the first plurality of punctured bits thereby generating a second plurality of unpunctured bits and a second plurality of punctured bits; and
a transmit driver for:
processing the first plurality unpunctured bits thereby generating and launching a first signal into a communication channel in accordance with a first transmission; and processing the second plurality unpunctured bits thereby generating and launching a second signal into the communication channel in accordance with a second transmission.

2. The communication device of claim 1, wherein:
the transmit driver processing a subset of the second plurality of punctured bits thereby generating and launching a third signal into the communication channel in accordance with a third transmission.

3. The communication device of claim 1, wherein:
the transmit driver processing a subset of the second plurality of punctured bits and a subset of the second plurality of unpunctured bits thereby generating and launching a third signal into the communication channel in accordance with a third transmission.

4. The communication device of claim 1, wherein:
the processing module including a puncturing module and a circular buffer;
the puncturing module puncturing the plurality of encoded bits thereby generating the codeword including the first plurality of punctured bits and the first plurality of unpunctured bits; and
the circular buffer circularly shifting the codeword in accordance with generating the second plurality of unpunctured bits.

5. The communication device of claim 1, wherein:
the processing module including a first puncturing module and a second puncturing module;
the first puncturing module puncturing the plurality of encoded bits thereby generating the codeword including the first plurality of unpunctured bits and the first plurality of punctured bits; and
the second puncturing module puncturing the first plurality of punctured bits thereby generating the second plurality of unpunctured bits and the second plurality of punctured bits.

6. The communication device of claim 1, wherein:
the communication device being a first communication device;
the first communication device coupled to a second communication device via the communication channel; and
the second communication device requesting the first communication device to transmit at least one additional signal including the first subset of the plurality of punctured bits encoded therein.

7. The communication device of claim 1, wherein:
the communication device being a first communication device;
the first communication device coupled to a second communication device via the communication channel; and
when the second communication device receiving the first signal from the first communication device including the first plurality of unpunctured bits encoded therein and detecting an error when decoding the first signal, the second communication device requesting the first communication device to transmit the second signal including the second plurality of unpunctured bits encoded therein.

8. The communication device of claim 1, wherein:
the communication device being a first communication device;
the first communication device coupled to a second communication device via the communication channel; and
when the second communication device receiving the first signal from the first communication device including the second plurality of unpunctured bits encoded therein encoded therein and detecting an error when decoding the first signal, the second communication device requesting the first communication device to transmit a third signal including at least one bit among the second plurality of punctured bits.

9. The communication device of claim 1, wherein:
the encoder being at least one of a turbo encoder, a turbo trellis coded modulation (TTCM) encoder, an LDPC (Low Density Parity Check) encoder, and a RS (Reed-Solomon) encoder.

10. The communication device of claim 1, wherein:
the communication device being implemented within at least one of a satellite communication system, a wireless communication system, a wired communication system, and a fiber-optic communication system.

11. A communication device, comprising:
an encoder for encoding at least one information bit thereby generating a plurality of encoded bits;
a processing module, including a puncturing module and a circular buffer, wherein:
  the puncturing module puncturing the plurality of encoded bits thereby generating a codeword including a first plurality of unpunctured bits and a first plurality of punctured bits; and
  based on the first plurality of punctured bits being passed back to the processing module, the puncturing module puncturing the first plurality of punctured bits thereby generating a second plurality of unpunctured bits and the circular buffer circularly shifting the codeword such that each respective bit thereof being shifted by a common amount, including wrapping around at least one bit from an end of the codeword to a beginning of the codeword, in accordance with generating a second plurality of punctured bits; and
a transmit driver for:
  processing the first plurality unpunctured bits thereby generating and launching a first signal into a communication channel in accordance with a first transmission; and
  processing the second plurality unpunctured bits thereby generating and launching a second signal into the communication channel in accordance with a second transmission.

12. The communication device of claim 11, wherein:
the transmit driver processing a subset of the second plurality of punctured bits thereby generating and launching a third signal into the communication channel in accordance with a third transmission.

13. The communication device of claim 11, wherein:
the transmit driver processing a subset of the second plurality of punctured bits and a subset of the second plurality of unpunctured bits thereby generating and launching a third signal into the communication channel in accordance with a third transmission.

14. The communication device of claim 11, wherein:
the processing module including a first puncturing module and a second puncturing module;
the first puncturing module puncturing the plurality of encoded bits thereby generating the codeword including the first plurality of unpunctured bits and the first plurality of punctured bits; and
the second puncturing module puncturing the first plurality of punctured bits thereby generating the second plurality of unpunctured bits and the second plurality of punctured bits.

15. The communication device of claim 11, wherein:
the communication device being a first communication device;

the first communication device coupled to a second communication device via the communication channel; and when the second communication device receiving the first signal from the first communication device including the first plurality of unpunctured bits encoded therein and detecting an error when decoding the first signal, the second communication device requesting the first communication device to transmit the second signal including the second plurality of unpunctured bits encoded therein.

16. The communication device of claim 11, wherein:
the first transmission being orthogonal to the second transmission.

17. The communication device of claim 11, wherein:
the encoder being at least one of a turbo encoder, a turbo trellis coded modulation (TTCM) encoder, an LDPC (Low Density Parity Check) encoder, and a RS (Reed-Solomon) encoder.

18. The communication device of claim 11, wherein:
the communication device being implemented within at least one of a satellite communication system, a wireless communication system, a wired communication system, and a fiber-optic communication system.

19. A communication device, comprising:
an encoder for encoding at least one information bit thereby generating a plurality of encoded bits;
a processing module for:
    puncturing the plurality of encoded bits thereby generating a codeword including a first plurality of unpunctured bits and a first plurality of punctured bits; and
    based on the first plurality of punctured bits being passed back to the processing module, puncturing the first plurality of punctured bits thereby generating a second plurality of unpunctured bits and a second plurality of punctured bits; and
a transmit driver for:
    processing the first plurality unpunctured bits thereby generating and launching a first signal into a communication channel in accordance with a first transmission;
    processing the second plurality unpunctured bits thereby generating and launching a second signal into the communication channel in accordance with a second transmission; and
    processing a subset of the second plurality of punctured bits thereby generating and launching a third signal into the communication channel in accordance with a third transmission.

20. The communication device of claim 19, wherein:
the transmit driver processing a subset of the second plurality of punctured bits and a subset of the second plurality of unpunctured bits thereby generating and launching a fourth signal into the communication channel in accordance with a fourth transmission.

21. The communication device of claim 19, wherein:
the processing module including a first puncturing module and a second puncturing module;
the first puncturing module puncturing the plurality of encoded bits thereby generating the codeword including the first plurality of unpunctured bits and the first plurality of punctured bits; and
the second puncturing module puncturing the first plurality of punctured bits thereby generating the second plurality of unpunctured bits and the second plurality of punctured bits.

22. The communication device of claim 19, wherein:
the communication device being a first communication device;
the first communication device coupled to a second communication device via the communication channel; and
when the second communication device receiving the first signal from the first communication device including the first plurality of unpunctured bits encoded therein and detecting an error when decoding the first signal, the second communication device requesting the first communication device to transmit the second signal including the second plurality of unpunctured bits encoded therein.

23. The communication device of claim 19, wherein:
the first transmission being orthogonal to the second transmission.

24. The communication device of claim 19, wherein:
the encoder being at least one of a turbo encoder, a turbo trellis coded modulation (TTCM) encoder, an LDPC (Low Density Parity Check) encoder, and a RS (Reed-Solomon) encoder.

25. The communication device of claim 19, wherein:
the communication device being implemented within at least one of a satellite communication system, a wireless communication system, a wired communication system, and a fiber-optic communication system.

* * * * *

UNITED STATES PATENT AND TRADEMARK OFFICE
CERTIFICATE OF CORRECTION

PATENT NO. : 8,145,970 B2  
APPLICATION NO. : 11/851147  
DATED : March 27, 2012  
INVENTOR(S) : Tak K. Lee et al.

Page 1 of 1

It is certified that error appears in the above-identified patent and that said Letters Patent is hereby corrected as shown below:

In the Claims

Col. 12, line 64, in claim 1: after "first plurality" insert --of--  
Col. 13, line 1, in claim 1: after "second plurality" insert --of--  
Col. 13, line 67, in claim 8: before "and detecting" delete "encoded therein"  
Col. 14, line 35, in claim 11: after "first plurality" insert --of--  
Col. 14, line 39, in claim 11: after "second plurality" insert --of--  
Col. 15, line 35, in claim 19: after "first plurality" insert --of--  
Col. 15, line 39, in claim 19: after "second plurality" insert --of--

Signed and Sealed this  
Fourteenth Day of May, 2013

Teresa Stanek Rea  
*Acting Director of the United States Patent and Trademark Office*